(12) United States Patent
Fung (10) Patent No.: US 9,337,190 B2
(45) Date of Patent: May 10, 2016

(54) SEMICONDUCTOR DEVICE INCLUDING DUMMY ISOLATION GATE STRUCTURE AND METHOD OF FABRICATING THEREOF

(71) Applicant: TAIWAN SEMICONDUCTOR MANUFACTURING COMPANY, LTD., Hsin-Chu (TW)

(72) Inventor: Ka-Hing Fung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 13/797,928

(22) Filed: Mar. 12, 2013

(65) Prior Publication Data
US 2014/0264609 A1 Sep. 18, 2014

(51) Int. Cl.
| | |
|---|---|
| H01L 21/76 | (2006.01) |
| H01L 27/088 | (2006.01) |
| H01L 21/761 | (2006.01) |
| H01L 27/02 | (2006.01) |
| H01L 29/66 | (2006.01) |
| H01L 21/8234 | (2006.01) |
| H01L 21/8238 | (2006.01) |
| H01L 27/092 | (2006.01) |
| H01L 29/49 | (2006.01) |
| H01L 21/762 | (2006.01) |

(52) U.S. Cl.
CPC ............ *H01L 27/088* (2013.01); *H01L 21/761* (2013.01); *H01L 21/7624* (2013.01); *H01L 21/823437* (2013.01); *H01L 21/823481* (2013.01); *H01L 21/823828* (2013.01); *H01L 21/823878* (2013.01); *H01L 27/0207* (2013.01); *H01L 27/092* (2013.01); *H01L 29/4966* (2013.01); *H01L 29/6681* (2013.01); *H01L 29/66545* (2013.01)

(58) Field of Classification Search
CPC . H01L 21/761; H01L 21/765; H01L 27/0207; H01L 29/6681
USPC .............. 257/641, E21.54, E21.544, E21.574
See application file for complete search history.

(56) References Cited

U.S. PATENT DOCUMENTS

| | | | |
|---|---|---|---|
| 6,373,111 B1 * | 4/2002 | Zheng et al. ................... | 257/407 |
| 6,953,719 B2 | 10/2005 | Doczy et al. | |
| 6,963,115 B2 | 11/2005 | Nakata et al. | |
| 8,680,619 B2 | 3/2014 | Zhu et al. | |

(Continued)

OTHER PUBLICATIONS

Chau, Robert, "Advanced Metal Gate/High-K Dielectric Stacks for High-Performance CMOS Transistors", Components Research, Logic Technology Dev., Intel Corporation, 3pgs.

(Continued)

*Primary Examiner* — Ermias Woldegeorgis
*Assistant Examiner* — John Bodnar
(74) *Attorney, Agent, or Firm* — Haynes and Boone, LLP (57) ABSTRACT

A device having a first active transistor, a second active transistor, an isolation gate structure, and an active region underlying each of the first active transistor, the second active transistor, and the isolation gate structure is provided. The first and second active transistors each have a metal gate with a first type of conductivity (e.g., one of n-type and p-type). The isolation gate structure interposes the first and second active transistors. The isolation gate structure has a metal gate with a second type of conductivity (e.g., the other one of n-type and p-type). A method of fabricating devices such as this are also described.

14 Claims, 10 Drawing Sheets

(56) References Cited

U.S. PATENT DOCUMENTS

| | | | |
|---|---|---|---|
| 2002/0053711 A1 | 5/2002 | Chau et al. | |
| 2004/0026759 A1* | 2/2004 | Nakabayashi | 257/499 |
| 2004/0036116 A1* | 2/2004 | Tran | 257/345 |
| 2004/0198009 A1* | 10/2004 | Chen et al. | 438/303 |
| 2006/0011994 A1* | 1/2006 | Lin et al. | 257/407 |
| 2007/0267680 A1* | 11/2007 | Uchino et al. | 257/315 |
| 2009/0230479 A1* | 9/2009 | Hsu et al. | 257/369 |
| 2010/0127333 A1 | 5/2010 | Hou et al. | |
| 2010/0237424 A1* | 9/2010 | Cheng et al. | 257/369 |
| 2011/0024843 A1 | 2/2011 | Asayama | |
| 2011/0147765 A1* | 6/2011 | Huang et al. | 257/77 |
| 2012/0052641 A1 | 3/2012 | Lee et al. | |
| 2012/0126336 A1* | 5/2012 | Anderson et al. | 257/392 |
| 2013/0309838 A1* | 11/2013 | Wei et al. | 438/424 |
| 2014/0106523 A1* | 4/2014 | Koldiaev et al. | 438/212 |

OTHER PUBLICATIONS

Korean Application No. 10-2013-0127035; Notice of Allowance dated Jul. 27, 2015; 3pp.

* cited by examiner

SEMICONDUCTOR DEVICE INCLUDING DUMMY ISOLATION GATE STRUCTURE AND METHOD OF FABRICATING THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, when a semiconductor device such as a metal-oxide-semiconductor field-effect-transistor (MOSFET) is scaled down through various technological nodes, device density and performance are challenged by the device layout and needed isolation. As the demands for circuit density increase, one area under study has been the implementation of a continuous active region. A continuous active region can reduce the need for insulating structures, thus, allowing for a reduction in die size, a reduction of stress on the substrate, and/or a reduction of current penalties attributable to the isolation structures. However, layout changes such as continuous active regions provide other challenges such as providing sufficient isolation between adjacent devices and maintaining device performance.

Therefore, existing methods and devices for improving isolation in semiconductor devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further still, there are two types of conductivity (n-type and p-type). One understands that embodiments directed to one type of conductivity can also apply to the opposite type.

Figure 1:
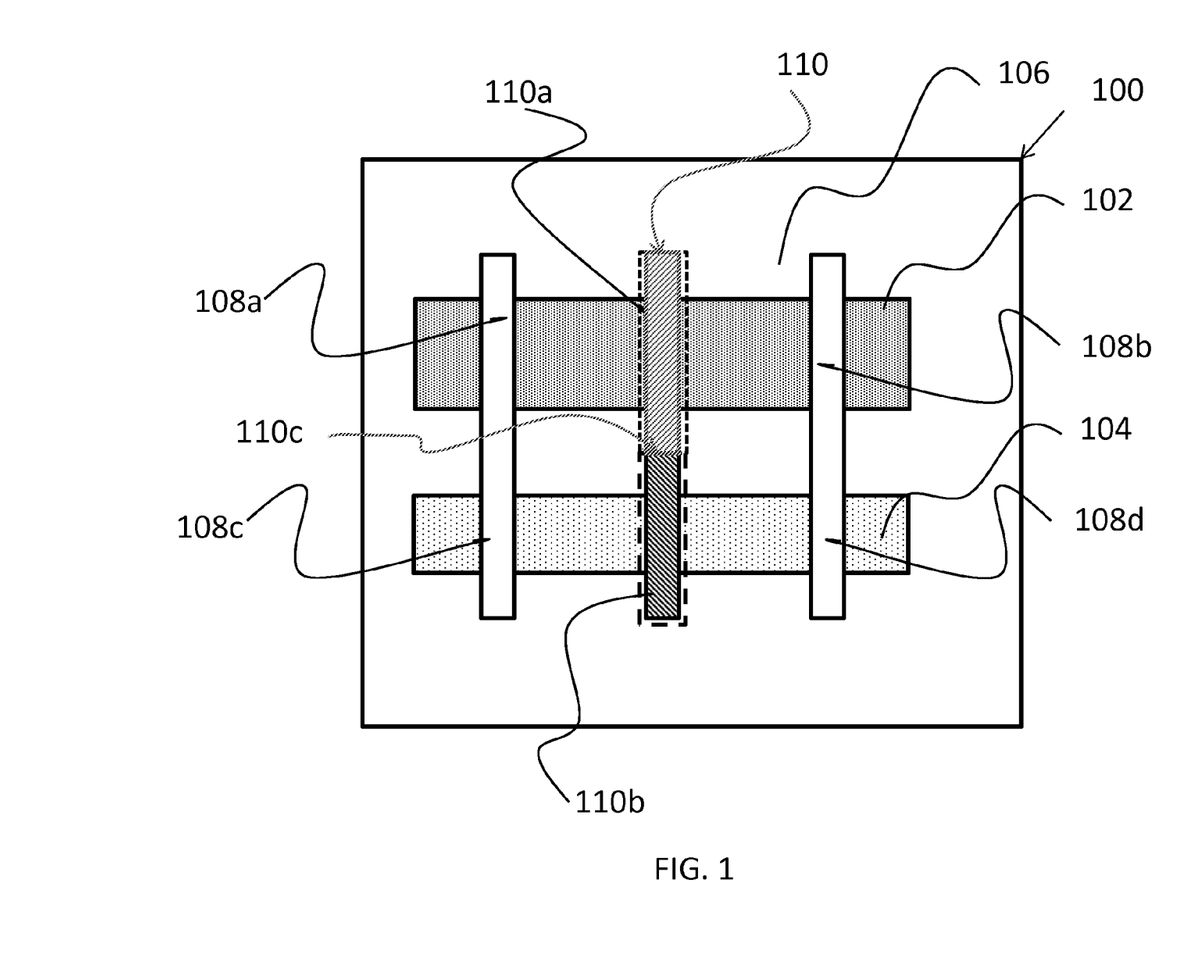
FIG. 1 is a plan view showing a layout of an embodiment of a semiconductor device having a continuous active region according to one or more aspects of the present disclosure.

Illustrated in FIG. 1 is a plan view of a layout 100 of a semiconductor device. The layout 100 includes a first continuous active region 102 and a second continuous active region 104. The first continuous active region 102 may be of a first type of conductivity (e.g., n-type or p-type); the second continuous active region 104 may be of a second type of conductivity (e.g., the other one of n-type or p-type). The continuous active regions 102 and 104 may be regions of a substrate having a suitable dopant profile (e.g., n-type or p-type doping). In an embodiment, the continuous active region 102 and/or 104 are diffusion layers or regions of a substrate. A continuous active region may be a region in which a plurality of gates of field effect transistors (FETs) are continuously arranged without being separated by an insulating structure such as a trench isolation structure.

Insulating region(s) 106 surround the continuous active regions 102 and 104. The insulating regions may be suitable isolation structures such as shallow trench isolation (STI) structures. STI structures may be trench regions of a substrate having insulating material disposed therein.

The layout 100 includes a plurality of gate structures 108 and 110 depicted as line elements in the layout 100. The gate structures 108 (108a, 108b, 108c, 108d) may be active or functional gates. An active gate is a functional and operable gates of a semiconductor device such as a field effect transistor (FET).

The gate structure 110 may be an isolation gate structure also referred to as a dummy isolation gate structure. A dummy gate structure does not provide an active or functional gate of a FET. The dummy isolation gate structure may be floating, tied to Vss or ground, be floating or have no interconnection (e.g., contact via or metal line) connected to it, be connected to Vdd, and/or other suitable states. In an embodiment, the dummy isolation gate structure provides a Vt sufficient to provide isolation between gate structures. In an embodiment, the gate structure 110a provides isolation between the active gate structures 108a and 108b and the gate structure 110b provides isolation between the active gate structures 108c and 108d. In an embodiment, each of the gate structures 108 and 110 are metal-type gate structures (e.g., including a metal gate electrode as opposed to, for example, polysilicon). The metal-type gate structures may be characterized by a work function value that they provide. A work function value is associated with the material composition of the work function layer, and thus, the material of the first work function layer is chosen to tune its work function value so that a desired threshold voltage Vt is achieved in the device that is to be formed in the respective region. Exemplary p-type conductivity work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type conductivity work function metals include Ti, Ag, TaAl, TaAlC, TiAlN, TaC, TaCN, TaSiN, Mn, Zr, other suitable n-type work function materials, or combinations thereof.

In an embodiment, the continuous active region 102 is of a first type of conductivity and gate structures 108a and 108b have a work function of a second (opposite) type of conductivity. For example in one embodiment, the continuous active region 102 is a p-type region and gate structures 108a and 108b are each n-type metal gate structures. In another example, the continuous active region 102 is an n-type region and gate structures 108a and 108b are p-type metal gate structures.

In an embodiment, the continuous active region 104 is of a second type of conductivity, different than that of the first type of conductivity of the active region 102. In a further embodiment, the gate structures 108c and 108d (overlying the active region 104 having the second type of conductivity) have a work function of a first type of conductivity. For example in one embodiment, the continuous active region 102 is a p-type region and gate structures 108a and 108b are n-type metal gate structures; the continuous active region 104 is a n-type region and gate structures 108a and 108b are p-type metal gate structures. Alternatively, the continuous active region 102 is an n-type region and gate structures 108a and 108b are p-type metal gate structures; the continuous active region 104 is a p-type region and gate structures 108a and 108b are n-type metal gate structures.

The gate structure 110 may be referred to as a dummy isolation gate structure, or simply an isolation gate structure. The isolation gate structure 110a may have the same conductivity of the continuous active region 102. The isolation gate structure 110a may have the opposite type of conductivity of the gate structures 108a and 108b. For example, in an embodiment, the continuous active region 102 is of a first type of conductivity, gate structures 108a and 108b have a work function of a second type of conductivity, and gate structure 110a is a metal gate having a work function of the first type of conductivity. For example in one embodiment, the continuous active region 102 is a p-type region; gate structures 108a and 108b are each n-type metal gate structures, thus providing nFET devices; gate structure 110a is a p-type metal gate structure. In other words, a p-type transistor gate provides isolation between two nFET devices. In another example, the continuous active region 102 is an n-type region; gate structures 108a and 108b are p-type metal gate structures; gate structure 110a is an n-type metal gate structure. In other words, an n-type transistor provides isolation between two pFET devices. The isolation gate structure 110a extends to interface 110c. Below (relative to FIG. 1 orientation) the interface 110c, the gate structure 110 is the isolation gate structure 110b. The interface 110c illustrates the interface between the gate structure 110a and 110b within the continuous line of gate structure 110.

Gate structure 110b may have the same conductivity of the continuous active region 104 and/or the opposite conductivity as gate structures 108c and 108d. For example, in an embodiment, the continuous active region 104 is of a second type of conductivity, gate structures 108c and 108d have a work function of a first type of conductivity, and gate structure 110a is a metal gate having a work function of a second type of conductivity. For example in one embodiment, the continuous active region 102 is a p-type region; gate structures 108a and 108b are each n-type metal gate structures; gate structure 110a is a p-type metal gate structure. In a further embodiment, the continuous active region 104 is an n-type region; gate structures 108c and 108d are each p-type metal gate structures; gate structure 110b is an n-type metal gate structure. In another example, the continuous active region 102 is an n-type region; gate structures 108a and 108b are p-type metal gate structures; gate structure 110a is a n-type metal gate structure. In this embodiment, the continuous active region 104 is a p-type region; gate structures 108c and 108d are each n-type metal gate structures; gate structure 110b is a p-type metal gate structure. Thus, in the nFET area of the substrate, a p-type metal gate structure may be used as an isolation transistor. In the pFET area of the substrate, an n-type gate structure may be used as an isolation transistor.

Thus, the layout 100 provides the use of an isolation gate structure having a metal gate that has the opposite type of work function as the active gates that the isolation gate structure interposes and isolates from one another. In the layout 100, both the active and isolation gates are disposed on a continuous active region.

Figure 2:
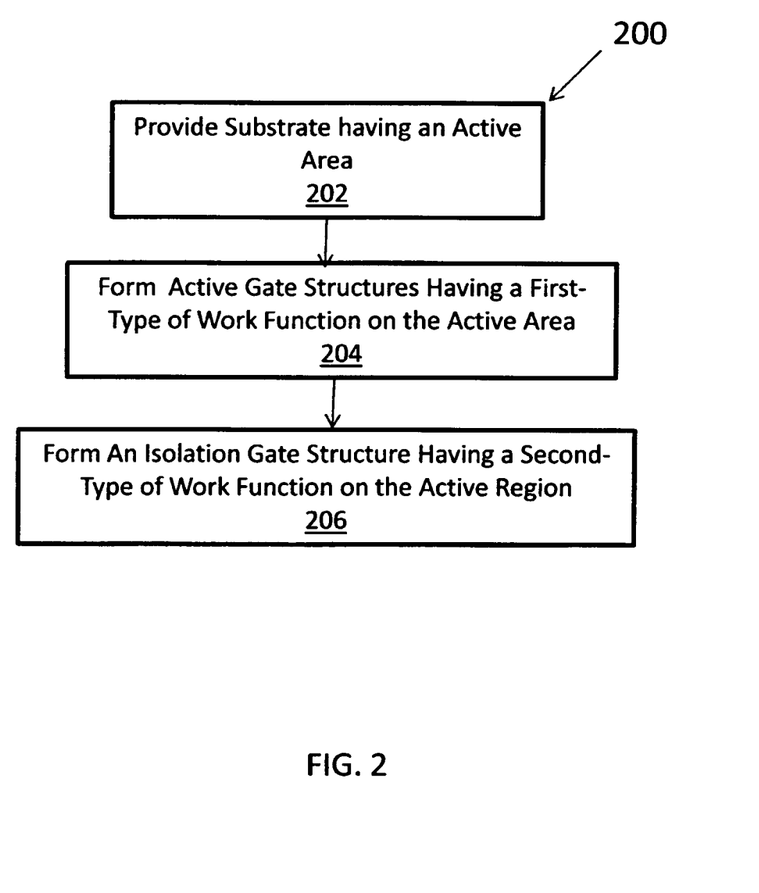
FIG. 2 is a flow chart illustrating an embodiment of a method of fabricating a semiconductor device according to one or more aspects of the present disclosure.

Referring now to FIG. 2, illustrated is a method 200 operable to form a semiconductor device having a dummy isolation gate structure providing isolation between gate features. A device according to the layout 100, described above with reference to FIG. 1, may be fabricated using the method 200. It is understood that the method 200 includes steps having features of a complementary metal-oxide-semiconductor (CMOS) technology process flow and thus, are only described briefly herein. Additional steps may be performed before, after, and/or during the method 200.

The method 200 begins at block 202 where a substrate having an active area is provided. The substrate may be a semiconductor substrate, such as a semiconductor wafer, is provided. The substrate may include silicon in a crystalline structure. In alternative embodiments, the substrate may include germanium, silicon germanium, silicon carbide, gallium arsenide, indium arsenide, indium phosphide, and/or other suitable materials. The substrate may be a silicon-on-insulator (SOI) substrate.

Various isolation regions are formed in the semiconductor substrate such that active region(s) are defined. The isolation regions may be shallow trench isolation (STI) structures formed in the semiconductor substrate. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

One or more active regions may be disposed on the substrate. The active regions may include continuous active regions, such as described above with reference to the layout 100 of FIG. 1. Additionally or alternatively, the substrate may also include active regions that are discontinuous active regions, such as active regions having an interposing insulating layer or feature (STI). The active regions may be suitably doped by introduction of an n-type or p-type dopant. The active regions may be fabricated by suitable processes such as ion implantation, diffusion, annealing, and/or other doping processes. The active regions may include a well region of a first type of conductivity (e.g., an n-well or p-well) disposed in a region (e.g., substrate) of a second type of conductivity. The active regions formed may be substantially similar to the active regions 102 and 104, described above with reference to the layout 100 of FIG. 1.

The method 200 then proceeds to block 204 where active or functional gate structures are formed on the active region of the substrate. Specifically, active gate structures having a first-type of work function conductivity may be formed on an active region having the second type of conductivity. Additionally, active gate structures having a second-type of work function conductivity may be formed on an active region having the first type of conductivity. The active gate structures may be associated with nFET or pFET devices. The active gate structures formed may be substantially similar to the gate structures 108, described above with reference to the layout 100 of FIG. 1.

An active gate structure may include a gate dielectric layer and/or a gate electrode. The active gate structures may be formed by a replacement gate process such as described in further detail below with reference to the method 300 of FIG. 3. Alternatively, the active gate structures may include metal gate structures formed by a gate-first method. In an embodiment, the gate electrode includes polysilicon. In a further embodiment, a first gate structure is formed may include a sacrificial gate dielectric layer and/or a sacrificial gate electrode; this gate structure may be subsequently removed from the substrate and a metal gate electrode formed in its place using replacement gate methodologies such as described below with reference to the method 300 of FIG. 3.

The active gate structures may include a metal gate structure that has interfacial layer(s), gate dielectric layer(s), capping layer(s), work function layer(s), fill metal layer(s) and/or other suitable materials for a metal gate structure. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable dielectric. The gate dielectric layer may include silicon dioxide or other suitable dielectric.

The gate dielectric layer may include a dielectric material such as, silicon oxide, silicon nitride, silicon oxy-nitride, dielectric with a high dielectric constant (high k), and/or combinations thereof. The gate dielectric layer may be formed using conventional processes such as, photolithography, oxidation, deposition, etching, and/or a variety of other processes known in the art. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

The gate electrode may be a metal gate electrode having a suitable work function. Exemplary p-type conductivity work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type conductivity work function metals include Ti, Ag, TaAl, TaAlC, TiAlN, TaC, TaCN, TaSiN, Mn, Zr, other suitable n-type work function materials, or combinations thereof. The work function layer(s) may be deposited by CVD, PVD, and/or other suitable process. A fill metal layer of the active gate structures may include Al, W, or Cu and/or other suitable materials. The fill metal may be formed by CVD, PVD, plating, and/or other suitable processes.

Source and/or drain features may be formed adjacent the active gate structures. The source/drain features may be suitably doped to provide the relevant conductivity desired to form the FET associated with the active gate structure. The source/drain features may be formed by suitable processes such as implantation, diffusion, annealing, and/or other doping processes. N-type or p-type dopants may be introduced to the active region to form the source/drain.

The method 200 then proceeds to block 206 where a dummy isolation gate structure(s) is formed on the substrate. The isolation gate structure may be substantially similar to the gate structure 110, described above with reference to layout 100 of FIG. 1. The isolation gate structure interposes at least two active gates, described above with reference to block 204. The isolation gate structure may provide for isolation between the active gates that it interposes. The isolation gate structure may include a metal-gate having the opposite type of conductivity (e.g., one of n-type metal and p-type metal) than that of the active gates it interposes (e.g., the other one of n-type metal and p-type metal). For example, in an embodiment, an n-type metal gate isolation structure interposes to pFET devices (having p-type conductivity).

The isolation gate structure may be formed by a replacement gate process such as described in further detail below with reference to the method 300 of FIG. 3. Alternatively, the isolation gate structure may include a metal gate structure formed by a gate-first method. An isolation gate structure may include a gate dielectric layer and/or a gate electrode.

In an embodiment, the gate electrode includes polysilicon. In a further embodiment, a first gate structure is formed may include a sacrificial gate dielectric layer and/or a sacrificial gate electrode; this gate structure may be subsequently removed from the substrate and a metal gate electrode formed in its place using replacement gate methodologies such as described below with reference to the method 300 of FIG. 3.

The isolation gate structures may include a metal gate structure that has interfacial layer(s), gate dielectric layer(s), capping layer(s), work function layer(s), fill metal layer(s) and/or other suitable materials for a metal gate structure. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable dielectric.

The gate dielectric layer may include a dielectric material such as, silicon oxide, silicon nitride, silicon oxy-nitride, dielectric with a high dielectric constant (high k), and/or combinations thereof. The gate dielectric layer may be formed using conventional processes such as, photolithography, oxidation, deposition, etching, and/or a variety of other processes known in the art. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

The gate electrode may be a metal gate electrode having a suitable work function. Exemplary p-type conductivity work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type conductivity work function metals include Ti, Ag, TaAl, TaAlC, TiAlN, TaC, TaCN, TaSiN, Mn, Zr, other suitable n-type work function materials, or combinations thereof. The work function layer(s) may be deposited by CVD, PVD, and/or other suitable process. A fill metal layer of the isolation gate structures may include Al, W, or Cu and/or other suitable materials. The fill metal may be formed by CVD, PVD, plating, and/or other suitable processes.

Source and/or drain features may be formed adjacent the isolation gate structure. The source/drain features may be suitably doped with n-type or p-type dopants. For example, for an-type conductivity isolation gate structure, n-type dopants may be introduced as a source/drain adjacent the isolation gate transistor. The source/drain features may be formed by suitable processes such as implantation, diffusion, annealing, and/or other doping processes.

Thus, in an embodiment, the isolation gate structure includes a metal gate having a work function with a first-type of conductivity (e.g., one of a p-type metal gate and an n-type metal gate). This isolation gate structure having the first type of conductivity interposes active gate structures having a second-type of conductivity (e.g., the other one of a p-type metal gate and an n-type metal gate). In a further embodiment, this isolation gate structure is formed on a continuous active region having the first-type of conductivity; the active gates also being formed on this continuous active region.

Specifically, active gate structures having a first-type of work function conductivity may be formed on an active region having the second type of conductivity. Additionally, active gate structures having a second-type of work function conductivity may be formed on an active region having the first type of conductivity. The active gate structures formed may be substantially similar to the active gate structures 108, described above with reference to the layout 100 of FIG. 1. Isolation gate of the opposite type of conductivity as the active gates interpose the active gates.

Figure 3:
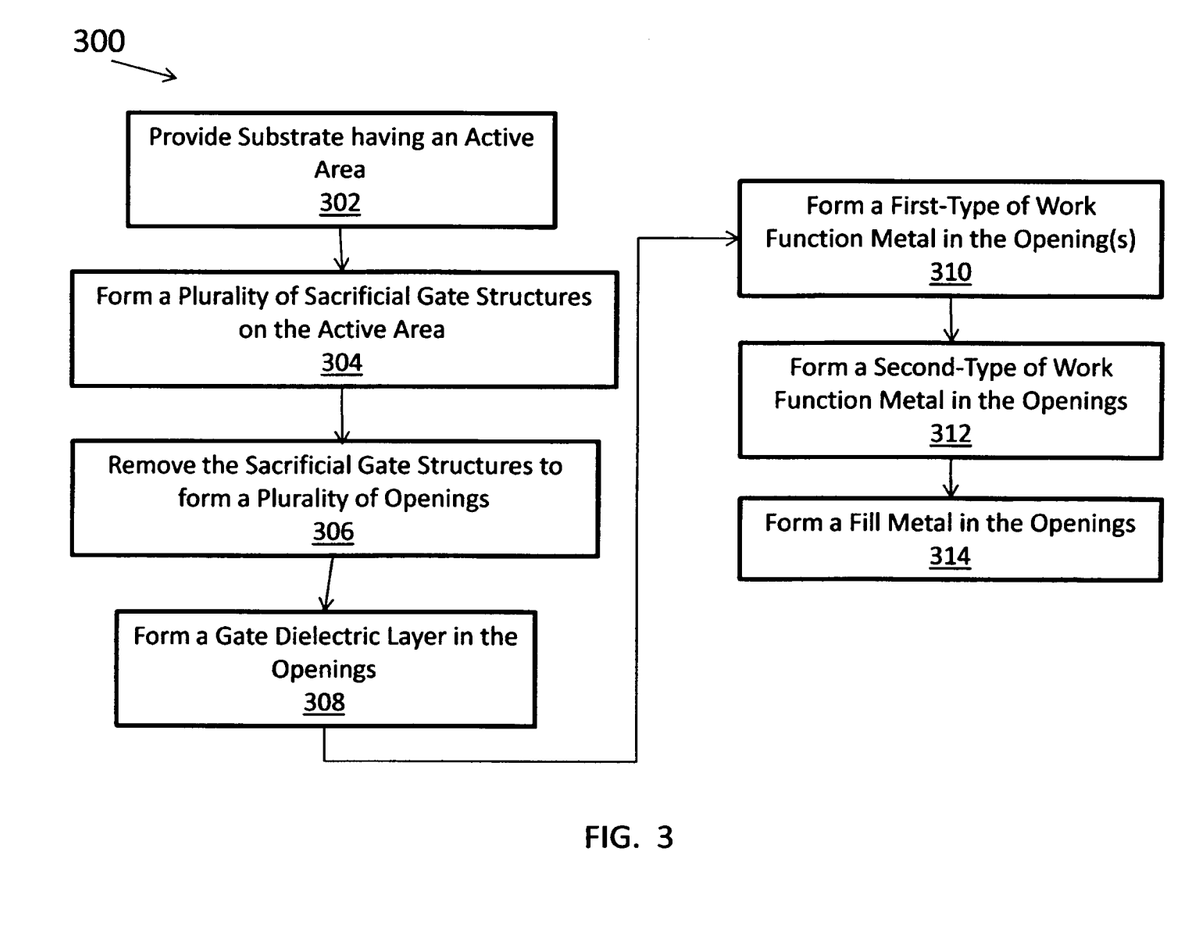
FIG. 3 is a flow chart of an embodiment of a method of fabricating a semiconductor device according to one or more steps of the method of FIG. 2.

Referring now to FIG. 3, illustrated is a method 300 of fabricating transistor gate structures according to one or more aspects of the present disclosure. FIGS. 4-10 are sectional views of one embodiment of a semiconductor device 400 having gate structures fabricated according to one or more steps of the method 300. The method 300 may be used to fabricate the device of layout 100 and/or layout 200 of FIG. 1.

It is understood that the method 300 includes steps having features of a complementary metal-oxide-semiconductor (CMOS) technology process flow and thus, are only described briefly herein. Additional steps may be performed before, after, and/or during the method 300. Similarly, one may recognize other portions of a device that may benefit from the doping methods described herein.

It is also understood that parts of the semiconductor device 400 may be fabricated by complementary metal-oxide-semiconductor (CMOS) technology process flow, and thus some processes are only briefly described herein. Further, the semiconductor device 400 may include various other devices and features, such as additional transistors, bipolar junction transistors, resistors, capacitors, diodes, fuses, etc., but is simplified for a better understanding of the inventive concepts of the present disclosure. The semiconductor device 400 includes a plurality of semiconductor devices (e.g., transistors), which may be interconnected. The device 400 illustrates a single isolation gate structure and two active transistor gate structures; this is provided for simplification and ease of understanding and does not necessarily limit the embodiment to any number of gate structures, active or isolation.

The device 400 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 300 begins at step 302 where a substrate having an active region is provided. Block 302 may be substantially similar to block 202 of the method 200, described above with reference to FIG. 2. For example, the substrate may be a semiconductor substrate having suitably doped regions (e.g., n-type or p-type) that provide active regions in which transistor devices (nFET or pFET) are disposed.

The method 300 then proceeds to block 304 where a plurality of sacrificial gate structures is formed on the active region. The sacrificial gate structures are formed as part of a gate-last or replacement gate process of forming the resulting transistors having a metal gate. The sacrificial gate structures may include polysilicon. The sacrificial gate structures may further include gate dielectric layers (sacrificial or functional), capping layers, hard mask layers, interface layers, and/or other suitable layers.

Figure 4:
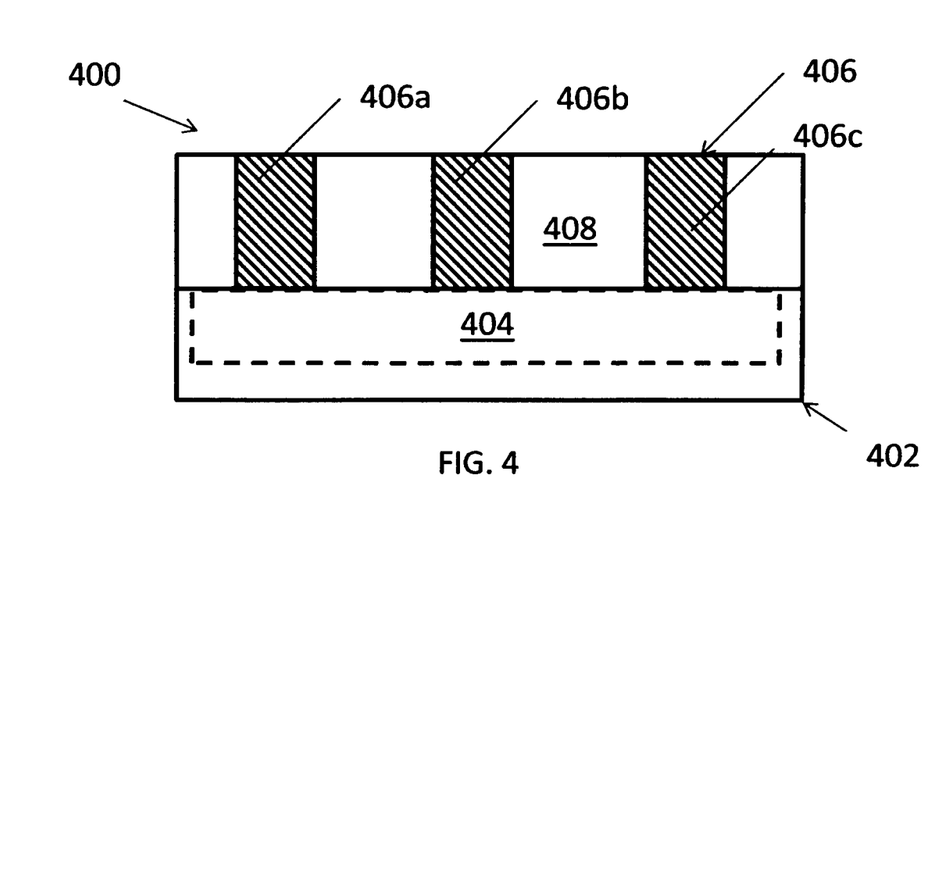
FIGS. 4-10 are cross-sectional views of an embodiment of a semiconductor device fabricated according to one or more steps of the method of FIG. 3.
Figure 5:
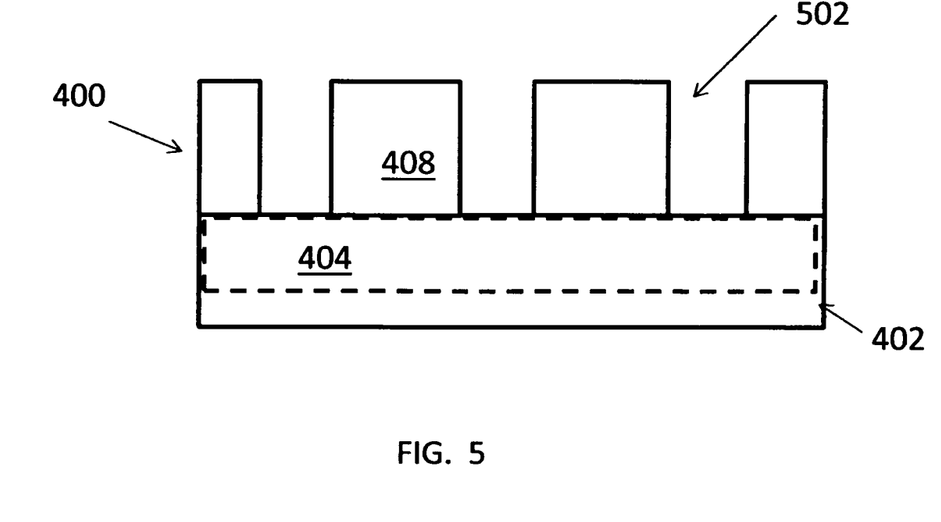

Referring to the example of FIG. 4, a device 400 is illustrated as having a substrate 402 having an active region 404 defined therein. The active region 404 may be a suitably doped region. A plurality of sacrificial gate structures 406 is disposed on the active region 404 of the substrate 402. The sacrificial gate structures 406 are to be replaced later by a high-k (HK) and metal gate (MG) after high thermal temperature processes are performed, such as thermal processes during sources/drains formation.

The sacrificial gate structures 406 are formed by any suitable process or processes. For example, the sacrificial gate structures 406 can be formed by a procedure including depositing, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The sacrificial gate structures 406 may include a gate dielectric such as silicon oxide, silicon nitride, or any other suitable materials. The sacrificial gate structures 406 may include a hard mask layer formed by any suitable material such as, silicon nitride, silicon oxynitride and silicon carbide.

In an embodiment, sidewall spacers may be disposed on the sidewalls of the sacrificial gate structures. The sidewall spacers may include a dielectric material such as silicon oxide, silicon nitride, silicon carbide, silicon oxynitride, or combinations thereof and be formed on the sidewalls of the gate structure 406. The sidewall spacers may include a multiple layers. Typical formation methods for the sidewall spacers include depositing a dielectric material over the sacrificial gate structures 406 and then etching back the dielectric material.

Before and/or after the formation of the sidewall spacers, source/drain features may be formed in the substrate 402 in the active region 404. The source/drain features may include doped regions including low-dose regions, epitaxially grown regions including raised source/drain features, and/or other suitable configurations.

Subsequently, an interlayer dielectric (ILD) layer 408 is formed between the sacrificial gate structures 406 on the substrate 402. The ILD layer 408 may include silicon oxide, oxynitride or other suitable materials. The ILD layer 408 may include a single layer or multiple layers. The ILD layer 408 is formed by a suitable technique, such as CVD, ALD and spin-on (SOG). A chemical mechanical polishing (CMP) process may be performed to remove excessive ILD layer 408 and planarize the top surface of the ILD layer 408 with the top surface of the sacrificial gate stacks 406.

The plurality of sacrificial gate structures 406 include structures designated for active or functional gate structures (e.g., associated with an nFET or pFET device) and isolation transistors (e.g., providing isolation between adjacent functional or active transistors). The gate structures 406a and 406c define a gate structure for an active transistor. The gate structure 406b define a gate structure for an isolation transistor. The sacrificial gate structure 406b defines an isolation gate structure substantially similar to the gate structures 110, described above with reference to FIG. 1. The sacrificial gate structures 406a and 406c define an active gate structure substantially similar to the gate structures 108, described above with reference to FIG. 1. In an alternative embodiment, gate structure 406b may also be formed on an isolation structure interposing discontinuous active regions.

The method 300 then proceeds to block 306 where the plurality of sacrificial gate structures is removed from the substrate to provide a plurality of openings or trenches. The removal of the sacrificial gate structures may be accomplished by suitable etching techniques such as wet etching. Referring to the example of FIG. 5, trenches 502 are formed on the substrate 402 by the removal of the gate structures 406 (FIG. 4).

The method 300 then proceeds to block 308 where a gate dielectric layer is formed in the opening/trenches provided in block 306. Forming the gate dielectric layer may include forming a high-k dielectric layer of a dielectric material having the dielectric constant higher than that of thermal silicon oxide, about 3.9. The dielectric material layer is formed by processes such as ALD, oxidation, CVD, metal organic chemical vapor deposition (MOCVD), physical vapor deposition (PVD), UV-Ozone Oxidation or molecular beam epitaxy (MBE), and/or other suitable processes. In an embodiment, a high-k dielectric layer of $HfO_2$ is formed. Alternatively, the high k dielectric material layer includes metal nitrides, metal silicates or other metal oxides such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

In some embodiments, an interfacial layer may be formed underlying the gate dielectric layer. The interfacial layer may be formed by ALD, oxidation and/or other suitable process and includes an oxide or other suitable dielectric material.

Figure 6:
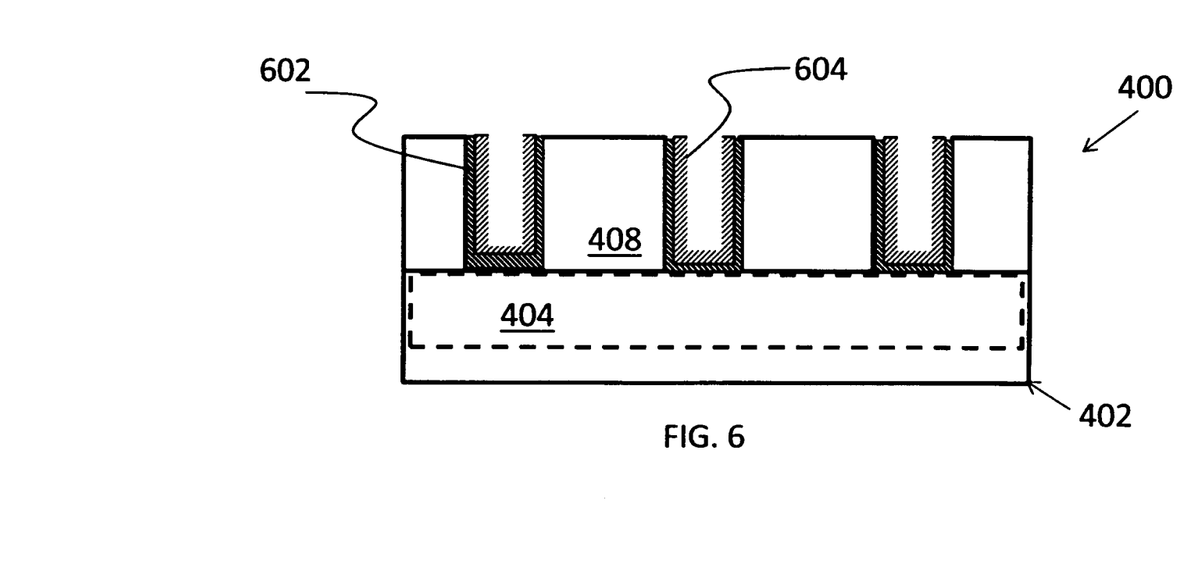

Referring to the example of FIG. 6, a gate dielectric layer 602 is disposed on the substrate 402 in the trenches 502.

In an embodiment, the method 300 may include forming a barrier metal layer between the first-type of work function layer (see block 310) and the gate dielectric layer formed in block 308. Referring to the example of FIG. 6, a barrier layer 604 is disposed in the trench 502. An anneal, such as a thermal anneal may be performed after forming the barrier layer. In an embodiment, the barrier layer is TiN or TaN; however, other compositions may be possible.

The method 300 then proceeds to block 310 where a first type of work function metal is formed in the openings. In an embodiment, the first type of work function metal is a p-type metal. In a further embodiment, the p-type metal is TiN. In other embodiments, the first type of work function metal is an n-type metal. Other exemplary metals include Ti, Ag, Al, TiAlN, TaC, TaCN, TaSiN, Mn, Zr, TaN, Ru, Mo, Al, WN, Cu, W, or any suitable materials. In an embodiment, the first type of work function metal is formed in the trenches defining the active transistors. In an embodiment, the first type of work function metal is selectively removed from one of the active transistors and/or the isolation transistor.

Figure 7:
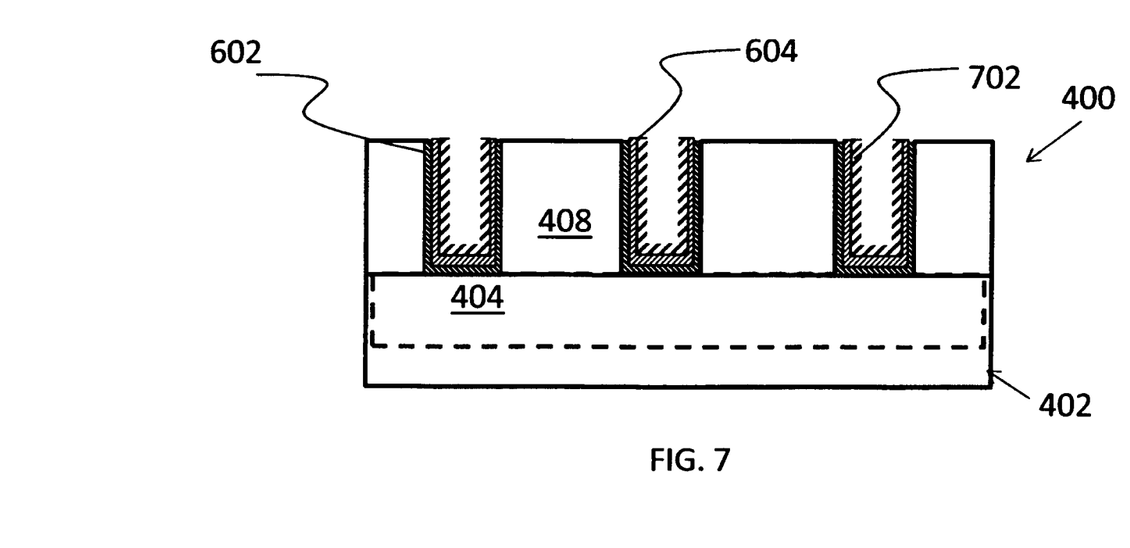
Figure 8:
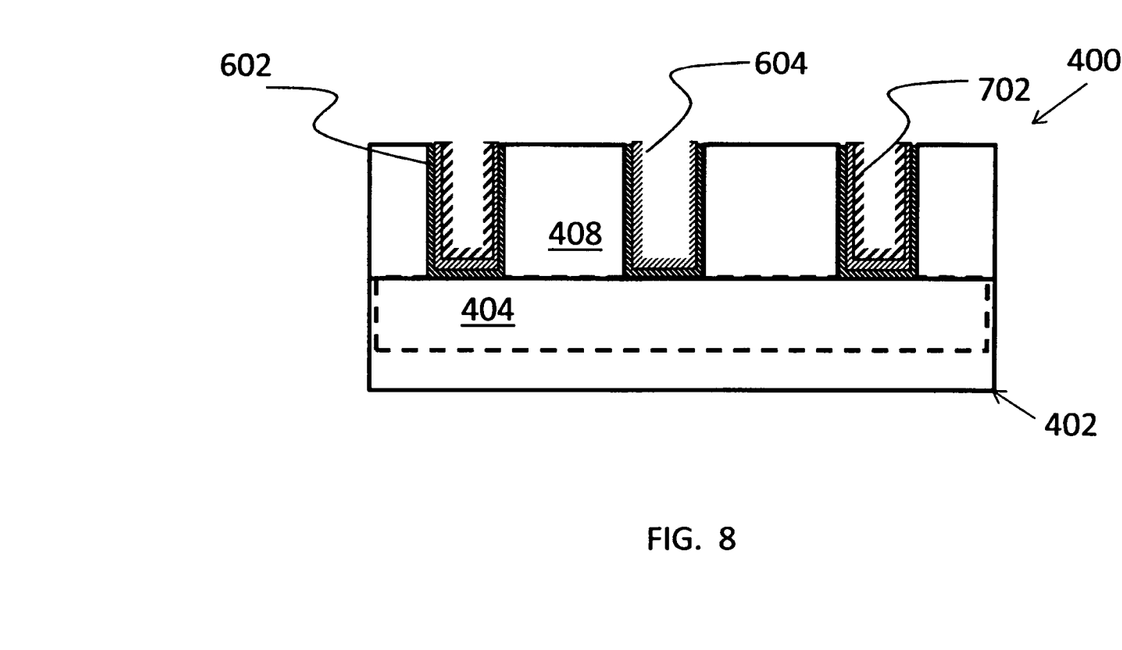
Figure 9:
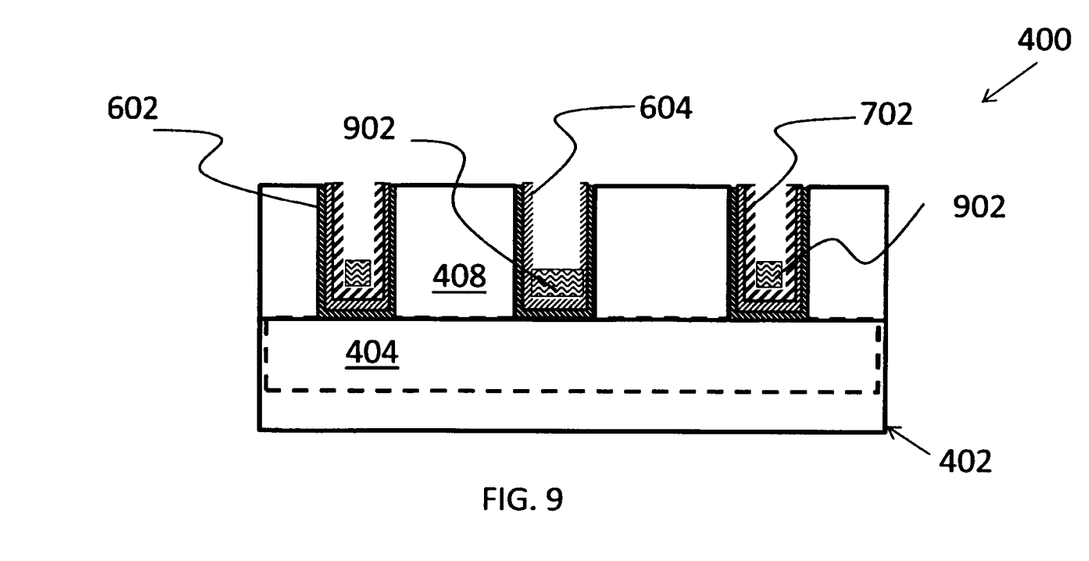

Referring to the example of FIG. 7, a first work function metal layer 702 is disposed in the trenches 502. In an embodiment, the metal layer 702 has a p-type conductivity work function. In a further embodiment, the metal layer 702 is TiN. As illustrated in FIG. 7, the first work function metal 702 is formed in each of the openings. Referring then to FIG. 8, illustrated is the device 400 after the first work function metal 702 has been selectively removed from the trench 502 associated with the isolation transistor.

The method 300 then proceeds to block 312 where a second-type of work function metal is formed in the openings. In an embodiment, the first-type of work function metal is a p-type metal and the second-type of work function metal is an n-type metal. In an embodiment, the n-type of work function metal is a n-type metal such as TiAlN. In other embodiments, the second type of work function metal include Ti, Ag, Al, TaC, TaCN, TaSiN, Mn, Zr, TiN, TaN, Ru, Mo, Al, WN, Cu, W, or any suitable materials. Referring to the example of FIG. 9, the second type of work function metal 902 is disposed in the trenches 502.

The method 300 then proceeds to block 314 where a fill metal is disposed in the remaining portion of the trenches or openings. A fill layer of the metal gate structure may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings. Referring to the example of FIG. 10, a fill layer 1002 is formed in the trenches. In an embodiment, the fill layer 1002 includes aluminum.

Figure 10:
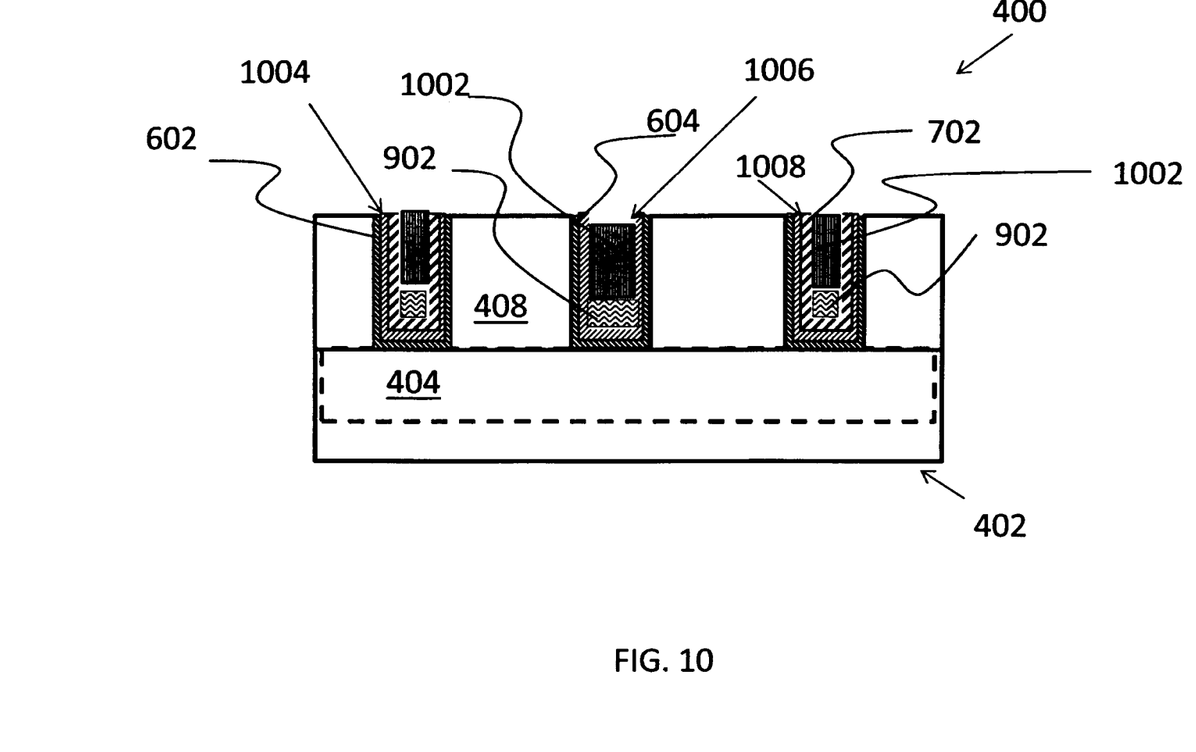

Thus, illustrated in FIG. 10 are a first gate structure 1004, a second gate structure 1006, and a third gate structure 1008. The first gate structure 1004 and the third gate structure 1008 may be active gate structures. The first gate structure 1004 and the third gate structure 1008 may be a first type of gate structure. For example, in an embodiment, the first gate structure 1004 and the third gate structure 1008 are p-type gate structures of pFET devices.

The second gate structure 1006 may be an isolation gate structure, for example, providing isolation between the first gate structure 1004 and the third gate structure 1008. The second gate structure 1006 may be a second type of gate structure, opposite the type of the first and third gate structures 1004 and 1008. For example, in an embodiment, the first gate structure 1004 and the third gate structure 1008 are p-type gate structures of pFET devices and the second gate structure 1006 is an n-type gate structure. The active region 404 may be suitably doped to provide the functional pFET devices.

The method 300 may continue to provide other steps including forming contacts to one or more of the gate structures and forming interconnect structures (e.g., multiple layer structures having conductive lines and vias) that interconnect the semiconductor devices of the substrate.

In summary, embodiments of the methods and devices disclosed herein provide for isolation gate structures interposing active gate structures where the isolation gate structure is a metal gate of an opposite type as the metal gates of the active gate structures for which it provides isolation. In doing so, embodiments of the present disclosure offer several advantages over prior art devices. Advantages of some embodiments the present disclosure include reducing a leakage path that may be provided by using a polysilicon dummy transistor to provide isolation between active transistors. This leakage path can cause the threshold voltage of the active transistors to be insufficient (e.g., for low-threshold voltage devices). It is understood that different embodiments disclosed herein offer different disclosure, and that they may make various changes, substitutions and alterations herein without departing from the spirit and scope of the present disclosure.

Thus, one will appreciate that one embodiment disclosed herein includes a device having a first active transistor, a second active transistor, an isolation gate structure, and an active region underlying the first active transistor, the second active transistor, and the isolation gate structure. The first and second active transistors each have a metal gate with a first type of conductivity (e.g., one of n-type and p-type). The isolation gate structure interposes the first and second active transistors. The isolation gate structure has a metal gate with a second type of conductivity (e.g., the other one of n-type and p-type).

In a further embodiment, the first type of conductivity is n-type and the second type of conductivity is p-type. Alternatively, the first type of conductivity may be p-type and the second type of conductivity n-type. In an embodiment, the active region is a continuous active region extending under the first and second active transistors and the isolation gate structure. For example, a continuous region may be one that extends under the referenced structures without interruption for example by insulating structure(s).

In a further embodiment, the device also includes a third active transistor and a fourth active transistor each having a metal gate with the second type of conductivity. A second isolation gate structure may interpose the third and fourth active transistors and have a metal gate with the first type of conductivity. In yet a further embodiment, a second active region underlies the third and fourth active transistors and the second isolation structure. In an embodiment, a shallow trench isolation structure interposes the active regions.

In another of the broader embodiments of a semiconductor device described herein, a device includes a first field effect transistor (FET) and a second FET. Each FET has an associated gate disposed on an active region. The active region may be a continuous active region, such as, for example, a continuous diffused region being suitably doped. The first and second FET are of a first type of conductivity (e.g., nFET or pFET). The device includes an isolation gate structure disposed on the active region and interposing the first and second FETs and isolating the first from the second FET. The isolation gate structure has a metal gate (e.g., rather than polysilicon gate elelctrode). The metal gate has a second type of conductivity (e.g., n-type or p-type opposite that of the FET).

In a further embodiment, the active region is a diffused region having the second type of conductivity. In an embodiment, the first and second gate structures include TiN (e.g., as a work function metal of the gate structure). In an embodiment, the metal gate of the isolation gate structure includes TiAlN (e.g., as a work function metal). The gate structures may further include a high-k dielectric material.

In another of the broader forms of embodiments described herein, illustrated is a method of semiconductor device fabrication. The method includes forming an active region in a semiconductor substrate; and forming a first field effect transistor (FET) and a second FET disposed in the active region. The first FET and the second FET have a first type of conductivity (e.g., one of n-type and p-type FETs (nFET or pFET)). The second FET is spaced a distance from the first FET. In this distance, an isolation gate structure is formed. The isolation gate structure has a metal gate having a second type of conductivity opposite the first type of conductivity.

In a further embodiment, forming the first and second FETs includes forming a first and second metal gate structure. To form the first and second metal gate structures a method may include forming a plurality of sacrificial polysilicon gate structures (see, e.g., FIG. 4) and then removing the plurality of sacrificial polysilicon gate structures to form a plurality of trenches (see FIG. 5). A first work function metal having the first type of conductivity is then formed in a first and second trench of the plurality of trenches. A second work function metal having the second type of conductivity is formed in a third trench of the plurality of trenches. The second work function metal may provide the metal gate of the isolation gate structure. In some embodiments, a high-k dielectric layer is also formed in each of the plurality of trenches.

In an embodiment, forming the active region includes forming a continuous doped region. Each of the first and second FET and the isolation gate structure are each disposed on the continuous doped region. An insulating layer (e.g., STI, LOCOS) may be formed on the semiconductor substrate surrounding the continuous doped region.

In an embodiment, the first FET and the second FET each include a metal gate having a work function metal with the first type of conductivity. The first type of conductivity is one of n-type and p-type and the second type of conductivity (of the isolation transistor) is the other one of n-type and p-type.

Numerous other embodiments are disclosed herein and recitation of the above embodiments is not provided to characterize or otherwise limit these numerous other embodiments.

What is claimed is:

1. A device, comprising:
   a first active transistor and a second active transistor, wherein the first and second active transistors each have a metal gate with a first type of work function, wherein the metal gate with the first type of work function includes a first material having the first type of work function and a second material disposed over the first material, the second material having a second type of work function;
   a third active transistor and a fourth active transistor, wherein the third and fourth active transistors each have a metal gate with the second type of work function, wherein the metal gate of the third active transistor is substantially collinear with the metal gate of the first active transistor and the metal gate of the fourth active transistor is substantially collinear with the metal gate of the second active transistor;
   an isolation gate structure, wherein the isolation gate structure has a first linear uninterrupted sidewall and an opposing second linear uninterrupted sidewall, and wherein the isolation gate structure includes:
   a first portion of the isolation gate structure interposing the first and second active transistors, wherein the first portion of the isolation gate structure has a metal gate with the second type of work function, wherein the metal gate of the first portion of the isolation gate structure has a layer of the second material disposed directly on a gate dielectric layer, wherein the first portion of the isolation gate structure defines a first portion of the first linear uninterrupted sidewall and a first portion of the opposing second linear uninterrupted sidewall; and
   a second portion of the isolation gate structure interposing the third and fourth active transistors, wherein the second portion of the isolation gate structure has a metal gate with the first type of work function, wherein the second portion of the isolation gate structure defines a second portion of the first linear uninterrupted sidewall and a second portion of the opposing second linear uninterrupted sidewall and a first active region underlying the first and second active transistors and the first portion of the isolation gate structure;

a second active region underlying the third and fourth active transistors and the second portion of the isolation structure; and an isolation region interposing the first and second active regions, wherein a third portion of the isolation gate structure overlies the isolation region, and wherein the third portion of the isolation gate structure defines a third portion of the first linear uninterrupted sidewall and a third portion of the opposing second linear uninterrupted sidewall, the third portions of the sidewalls connecting the first and second portions of the sidewalls.

2. The device of claim 1, wherein the first type of work function is n-type and the second type of work function is p-type.

3. The device of claim 1, wherein the first type of work function is p-type and the second type of work function is n-type.

4. The device of claim 1, wherein the first active region is a continuous active region extending under the first and second active transistors and the isolation gate structure.

5. A semiconductor device, comprising:

a first field effect transistor (FET) having a first gate structure and a second FET having a second gate structure wherein each of the first and second FETs are disposed on a first active region, wherein the first and second FETs are p-FETs, and wherein each of the first gate structure and the second gate structure include:

a high-k dielectric layer;

a first work function metal layer having a p-type work function metal composition;

a second work function metal layer and having an n-type work function metal composition; and a fill layer on the n-type work function metal composition;

on a second active region, spaced from the first action region, a third field effect transistor (FET) and a fourth FET, wherein each of the third and fourth FETs include gate structures having the n-type work function metal composition; and an isolation gate structure disposed on the first active region and the second active region and wherein a first portion of the isolation gate structure interposes the first and second FETs and a second portion of the isolation gate structure interposes the third and fourth FETs, wherein the first portion of the isolation gate structure has a first metal gate with an n-type work function, wherein the first metal gate of the isolation gate structure includes:

the high-k dielectric layer;

a layer of the n-type work function metal composition; and the fill layer;

and wherein the isolation gate structure isolates the first FET from the second FET; and wherein the second portion of the isolation gate structure has a second metal gate with a p-type work function, the first and second portions of the isolation gate structure directly interfacing over an isolation region between the first and second active regions.

6. The semiconductor device of claim 5, wherein the active region is a diffused region having a conductivity of the second type.

7. The semiconductor device of claim 5, wherein the first work function metal layer has the p-type work function metal composition of TiN.

8. The semiconductor device of claim 7, wherein the second work function metal layer has the n-type work function metal composition of TiAlN.

9. The semiconductor device of claim 5, wherein the first active region is a continuous active region having a single diffused region underlying the first and second FETs and the isolation gate structure.

10. The device of claim 1, wherein the metal gate of the first active transistor includes the first material of TiN and the second material of TiAlN.

11. The semiconductor device of claim 5, wherein each of the first and second gate structures further include a barrier layer.

12. The semiconductor device of claim 11, wherein the barrier layer includes TaN.

13. The device of claim 1, wherein the metal gate of the first active transistor and the metal gate of the first portion of the isolation gate structure each include a fill layer; wherein the fill layer is disposed directly on the second material.

14. The device of claim 1, wherein the first portion of the isolation gate structure has a first end and a second end, the first end directly interfacing a first end of the second portion of the isolation gate structure.

* * * * *